(12) United States Patent
Seven

(10) Patent No.: US 7,315,204 B2  
(45) Date of Patent: Jan. 1, 2008

(54) CLASS AB-D AUDIO POWER AMPLIFIER

(75) Inventor: Kazim Seven, Pijnacker (NL)

(73) Assignee: National Semiconductor Corporation, Santa Clara, CA (US)

( * ) Notice: Subject to any disclaimer, the term of this patent is extended or adjusted under 35 U.S.C. 154(b) by 209 days.

(21) Appl. No.: 11/177,092

(22) Filed: Jul. 8, 2005

(65) Prior Publication Data

US 2007/0018719 A1   Jan. 25, 2007

(51) Int. Cl.  
*H03F 1/14* (2006.01)

(52) U.S. Cl. .................................................. 330/51

(58) Field of Classification Search ............... None  
See application file for complete search history.

(56) References Cited

U.S. PATENT DOCUMENTS

| | | | |
|---|---|---|---|
| 6,396,933 B1 | 5/2002 | Jung et al. | 381/96 |
| 6,587,670 B1 | 7/2003 | Hoyt et al. | 455/63 |

OTHER PUBLICATIONS

W. Marshall Leach, Jr., "The Class-D Amplifier," *Introduction to Electroacoustics and Audio Amplifier Design*, Second Edition, Kendall/Hunt, 2001 (6 pages).

"LM4670 Filterless High Efficiency 3W Switching Audio Amplifier," *National Semiconductor Corporation*, Dec. 2004 (18 pages).

*Primary Examiner*—Benny Lee  
*Assistant Examiner*—Alan Wong  
(74) *Attorney, Agent, or Firm*—Brett A. Hertzberg; Merchant & Gould PC

(57) ABSTRACT

Audio power amplifier circuits that are arranged to operate in either a class AB or a class D operating mode. A drive circuit is configured to share control between a class AB driver and a class D modulator/driver circuit. The input signal level is monitored to determine their levels. When the input signal level is below a minimum signal level, the audio power amplifier circuits are operated in a standby mode. The power amplifier circuits are operated in a class AB mode when the input signal levels are in a defined operating range that exceeds the minimum signal level. When the input signal levels exceed a maximum signal threshold, the power amplifier circuits are operated in a class D mode. Hysterisis can be employed to minimize oscillation conditions about any one particular trip-point for the operating modes.

21 Claims, 9 Drawing Sheets

CLASS AB-D AUDIO POWER AMPLIFIER

FIELD OF THE INVENTION

The present disclosure generally relates to audio amplifier circuits. More particularly, the present disclosure relates to an audio amplifier circuit that can operate either in a class AB operating mode or a class D operating mode depending on an amount of output power that is demanded from the amplifier.

BACKGROUND

Audio amplifier circuits have a somewhat unique problem in that they are required to translate electrical signals in the electronics world into a moving pressure wave in the physical world. A speaker is used to translate currents from the audio amplifier circuits into a moving pressure wave. The pressure wave is created by using the speaker to force a mass of air to move along an axis of movement towards the listener. The particles in the forced mass of air collide with the air particles that are in front of the direction of movement causing compression of the air, or increased pressure. Compressed air has a higher number of molecules than uncompressed air such that there is an increase in the number of collisions with adjacent air particles. The compressed air particles then collide with the particles in front of them, which collide with the particles in front of them, and so on, creating a moving pressure wave. The air eventually is received into the inner ear, which senses the fluctuations in the air pressure, and translates the fluctuations into electrical signals that the human brain can understand. Simply, the rate of vibration of the air is translated by the brain into pitch (or frequencies), while the amplitude of the fluctuations (or sound pressure level) is translated by the brain into volume.

Speakers have a rated efficiency that simply maps the speaker's ability to translate power into sound pressure levels. The power levels that are necessary for an audio amplifier to effectively drive a speaker sufficient for a typical listener is related to a number of factors including the size of the speaker, the efficiency rating of the speaker, and the size of the listening area. For example, a pair of headphones operates like small speakers that are located in close proximity to the ear. Since the distance between these small speakers and the inner ear is very close, the efficiency of delivery of sound from these small speakers is very high. In contrast, a speaker that is located in a room several feet from the listener's ear does not deliver sound as efficiently since a greater mass of air must be moved to reach the outer ear, and then only a portion of that mass is received in the inner ear. As a result of the physics of air movement and related issues, the total amount of power that is necessary to drive the speaker to acceptable volume levels in headphones is significantly smaller than similar perceived volume levels in speakers in a large room.

Typically, a transistor amplifier is used to drive each speaker. The available power that can be delivered to a speaker by a transistor amplifier is related to many factors including the class of operation. Although a variety of amplifier classes are described below, the most popular amplifier classes for audio amplifiers are: class A, class AB, and class D.

Class A amplifiers typically include transistors that are biased so that variations in input signal polarities occur within the limits of cutoff and saturation associated with the transistors. In a PNP transistor, for example, if the base becomes positive with respect to the emitter, holes will be repelled at the PN junction and no current can flow in the collector circuit. This condition is known as cutoff. Saturation occurs when the base becomes so negative with respect to the emitter that changes in the signal are not reflected in collector-current flow. By maintaining the transistors biased in this manner, with the DC operating point between cutoff and saturation, the current in the transistor flows during the complete cycle (360 degrees) of the input signal.

Class B amplifiers typically include transistors that are biased so that collector current is cutoff during one-half of the input signal. The DC operating point for this class of amplifier is set up so that base current (in a PNP or NPN style transistor) is zero with no input signal. When a signal is applied, one half cycle will forward bias the base-emitter junction and collector current will flow. The other half cycle will reverse bias the base-emitter junction and collector current will be cut off. Thus, for class B operation, collector current will flow for approximately 180 degrees (half) of the input signal. Class B amplifier have no wasted power when there is no input signal since the transistors are biased in cutoff. However, since the initial input signal must overcome the cutoff point of the transistors, class B amplifiers have a dead spot where the transistors are cut off that creates a distortion characteristic in the output signal known as crossover distortion. Crossover distortion results in a loss of fidelity, or faithful reproduction, relative to the input signal.

Class C amplifiers typically include transistors that are biased such that collector current flows for less than one half cycle of the input signal. By reverse biasing the emitter-base junction (in a PNP or NPN type transistor), the DC operating point of the transistor is below cutoff and allows only the portion of the input signal that overcomes the reverse bias to cause collector current flow. Although the efficiency rating of class C amplifiers is quite high, their fidelity is very poor.

Class AB amplifiers typically include transistors that are biased so that the collector current is zero (cutoff) for a portion of one cycle of the input signal. This can be accomplished by making the forward-bias voltage less than the peak value of the input signal. The base-emitter junction will then be reverse biased during one cycle until the input signal voltage exceeds the forward-bias voltages. The resulting collector current will flow for more than 180 degrees but less than 360 degrees of the input signal. As compared to the class A amplifier, the DC operating point for the class AB amplifier is closer to cutoff. Class AB operated amplifiers are commonly used as a push-pull amplifier (one circuit for the positive input cycle and one circuit for the negative input cycle) to overcome crossover distortion that commonly occurs with class B amplifiers.

Class D amplifiers typically include transistors that are operated as switches. When the switches are off, the current through the switch is zero. When the switch is on, the voltage across the switch is small and current is delivered through the switch. The audio input signal is translated into a series of pulses for which the width and time duration of each pulse is related to the instantaneous amplitude of the input signal. The current pulses are delivered to a low pass filter circuit that commonly consists of an inductor (L) and a capacitor (C). The low pass filter passes the average value of the pulses to the speaker. Class D amplifiers have a very high efficiency in delivering higher power to the speaker.

BRIEF DESCRIPTION OF THE DRAWINGS

Non-limiting and non-exhaustive embodiments are described with reference to the following drawings.

DETAILED DESCRIPTION

Figure 1:
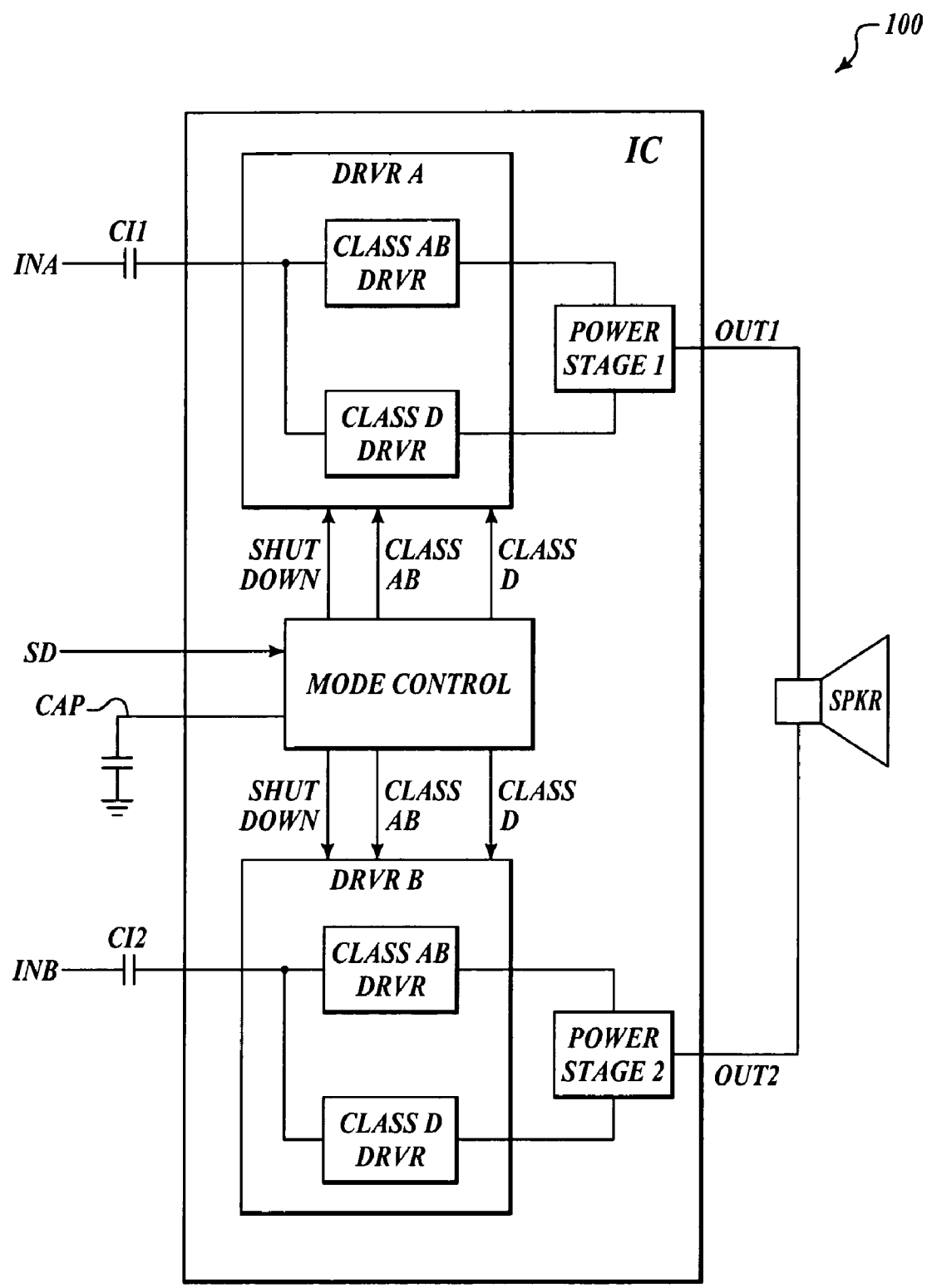
FIG. 1 is a block diagram for an example class AB-D amplifier system.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to audio power amplifier circuits that are arranged to operate in either a class AB or a class D operating mode. A drive circuit is configured to share control between a class AB driver and a class D modulator/driver circuit. The input signal level is monitored to determine their levels. When the input signal level is below a minimum signal level, the audio power amplifier circuits are operated in a standby mode. The power amplifier circuits are operated in a class AB mode when the input signal levels are in a defined operating range that exceeds the minimum signal level. When the input signal levels exceed a maximum signal threshold, the power amplifier circuits are operated in a class D mode. Hysterisis can be employed to minimize oscillation conditions about any one particular trip-point for the operating modes.

The present disclosure provides for an amplifier circuit that can be dynamically changed between a class AB operating mode and a class D operating mode. The class AB amplifier mode exhibits excellent linear amplification characteristics with low total harmonic distortion (THD) and no switching losses, extending battery life in battery powered application. The class D amplifier mode has high efficiency properties relative to the class AB amplifier mode, but typically exhibits poorer electromagnetic interference (EMI) properties. The operating modes are dynamically selected based upon detected signal levels such as the input signal levels and the output signal levels. When the detected signal levels are low, the class AB operating mode is selected maintaining better EMI performance. When the signal levels are high, a class D operating mode is selected such that power is delivered to the load with increased efficiency. When the demand for high signal levels has ended, the operating mode can again change back to a class AB operating mode to reduce EMI, and provide better linear amplification properties. Additional benefits that are contemplated include reduced power consumption based on output level demand, as well as others.

FIG. 1 is a block diagram for an example class AB-D amplifier system (100) that may be implemented as an integrated circuit (IC). The class AB-D amplifier includes two separate signal driver paths that can be arranged for operation as a bridge amplifier. The first signal driver path (DRVRA) receives input signal INA via ac-coupling capacitor CI1, and provides an output signal (OUT1) to one side of a speaker load (SPKR) through a first power stage (POWER STAGE 1). The second signal driver path (DRVRB) receives input signal INB via ac-coupling capacitor CI2, and provides an output signal (OUT2) to the other side of the speaker load (SPKR) through a second power stage (POWER STAGE 2).

A mode control circuit is arranged to change the operating mode of each of the signal path drivers depending on the demands of the system. Each signal path includes a class AB driver and a class D driver that are effectively arranged to operate in parallel with respect to one another in the audio signal path. However, in one implementation, the mode control circuit is arranged such that the class AB driver and the class D driver are not active at the same time. When the shutdown mode is active, or standby, the drivers are disabled so that power is conserved and the speaker is silent. When the input signal is detected in a range that exceeds a minimum signal threshold (e.g., 1 mV, 5 mV, etc.), the mode control circuit selects a class AB operating mode. The mode control circuit selects a class D operating mode when the input signal exceeds some maximum threshold value.

Additional control circuits can also disable or shut down the drivers in each driver path via respective shut down control signals. The additional control circuits can be combined with the mode control circuit. In one example, at least one of the driver paths is shut down when an overload or short-circuit condition is detected. In another example, at least one of the driver paths is shut down when an over-temperature condition is detected. In still another example, at least one of the driver paths is shut down by user selection via an external shut down control signal (e.g., SD). In yet another example, at least one of the driver paths are shut down during a power on reset (POR) condition. Other examples of shut down scenarios are contemplated within the spirit of the present disclosure.

Figure 2:
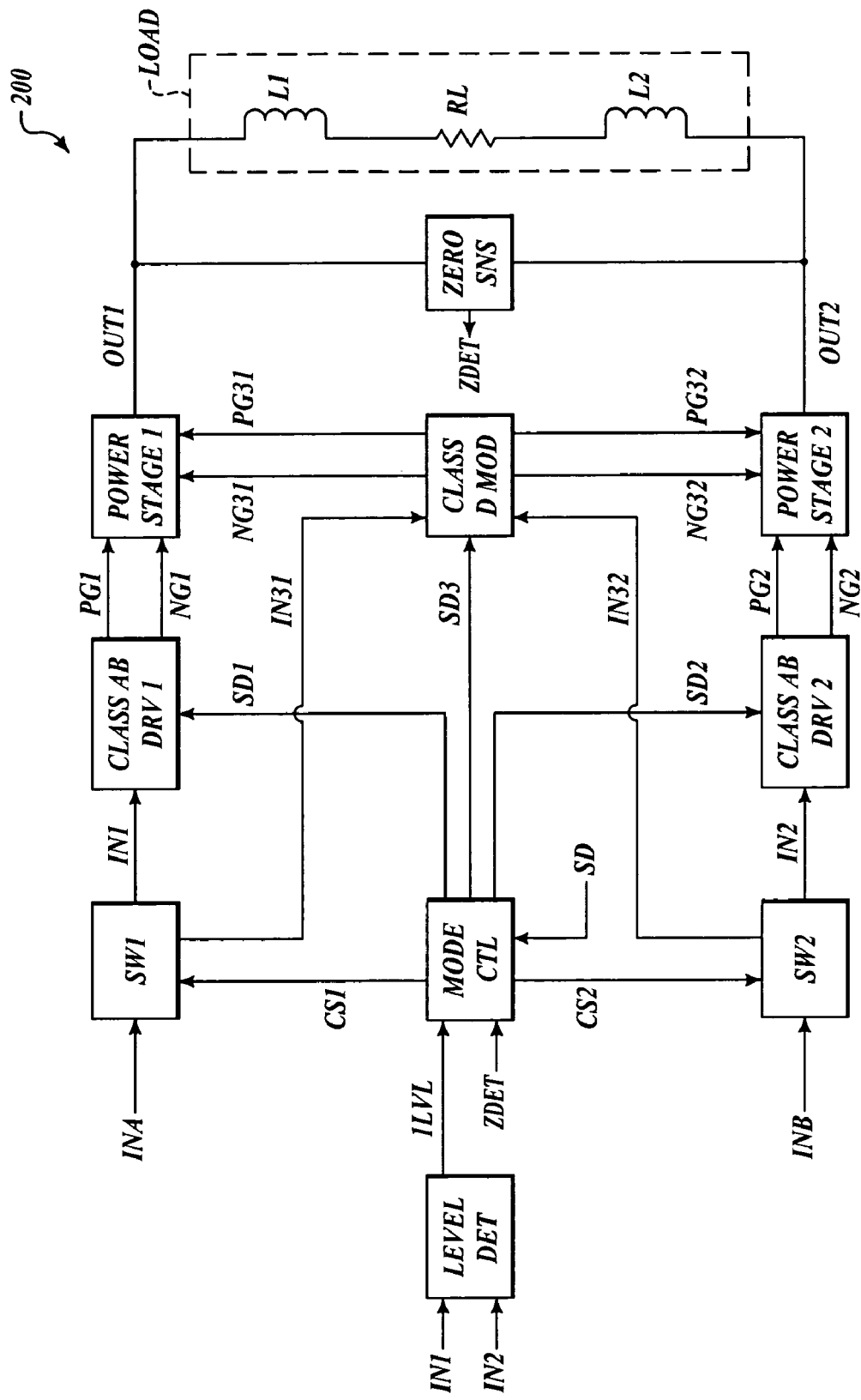
FIG. 2 is a block diagram of another class AB-D amplifier system.

FIG. 2 is a block diagram of another class AB-D amplifier system (200) that may also be implemented in an IC. Class AB-D amplifier system 200 includes a level detection circuit (LEVEL DET), a mode control circuit (MODE CTL), switching circuits (SW1/2), two class AB driver circuits (CLASS AB DRV1/DRV2), a class D modulator circuit (CLASS D MOD), two power stage circuits (POWER STAGE 1/2), and a zero output sensing circuit (ZERO SNS). The amplifier system is arranged to drive a load such as a speaker, which may be represented as a complex impedance comprising series coupled: inductor L1, resistor RL, and inductor L2.

Switching circuit SW1 is arranged to selectively couple input signal INA to at least one of CLASS D MOD and CLASS AB DRV1 as signals IN1 and IN31, respectively, in response to control signal CS1. Switching circuit SW2 is arranged to selectively couple input signal INB to at least one of CLASS D MOD and CLASS AB DRV2 as signals IN2 and IN32, respectively, in response to control signal CS2.

CLASS AB DRV1 is arranged to generate two drive signals (PG1, NG1) in response to signal IN1, when enabled. CLASS AB DRV2 is arranged to generate two drive signals (PG2, NG2) in response to signal IN2, when enabled. CLASS D MOD is arranged to generate drive signals NG31, PG31, NG32 and PG32 in response to signals IN31 and IN3, when enabled. POWER STAGE 1 is responsive to signals PG1, NG1, PG31 and NG31 to generate output signal OUT1. POWER STAGE 2 is responsive to signals PG2, NG2, PG32 and NG32 to generate output signal OUT2. Output signals OUT1 and OUT2 are provide across the load circuit (e.g., a speaker).

ZERO SNS is arranged to monitor output signals OUT1 and OUT2 and provide sense signal ZDET, which indicates that the current in the load (e.g., the speaker) is at a substantially zero current level (e.g., below a minimum/noise signal levels). ZDET is utilized by the mode control circuitry (MODE CTL) to hold-off on changes between class D mode and class AB mode until the load (e.g., the speaker) has dissipated all of its stored energy (e.g., inductor current is zero). Once the energy is dissipated, the transition change between class D mode and class AB mode has little or no perceivable click or pop in the output. LEVEL DET is arranged to provide an input signal level indicator signal (ILVL) in response to monitoring the input signal levels IN1 and IN2. LEVEL DET may optionally also monitor signal INA and INB.

MODE CTL is arranged to provide control signals CS1, CS2, SD1, SD2 and SD3 in response to signals ILVL, ZDET, and SD. Signals SD1, SD2, and SD3 are arranged to selectively enable or disable (shut down) CLASS AB AMP1, CLASS AB AMP2, and CLASS D MOD, respectively.

Signals CS1 and CS2 are arranged to control the flow of signal INA and INB to the various amplifier inputs. In one example, IN1 is coupled to a signal ground (either through a passive pull-up/down, or actively through a switching device) when signal INA is coupled to CLASS D MOD via signal IN31. In another example, IN1 is isolated from signal INA when signal INA is coupled to CLASS D MOD. In still another example, IN31 is coupled to a signal ground (either through a passive pull-up/down, or actively through a switching device) when signal INA is coupled to CLASS AB AMP1 via signal IN1. In yet another example, IN31 is isolated from signal INA when signal INA is coupled to CLASS AB AMP1. Signals IN2 and IN32 can be arranged to provide like functionality to that described with respect to signal IN1 and IN31.

Figure 4:
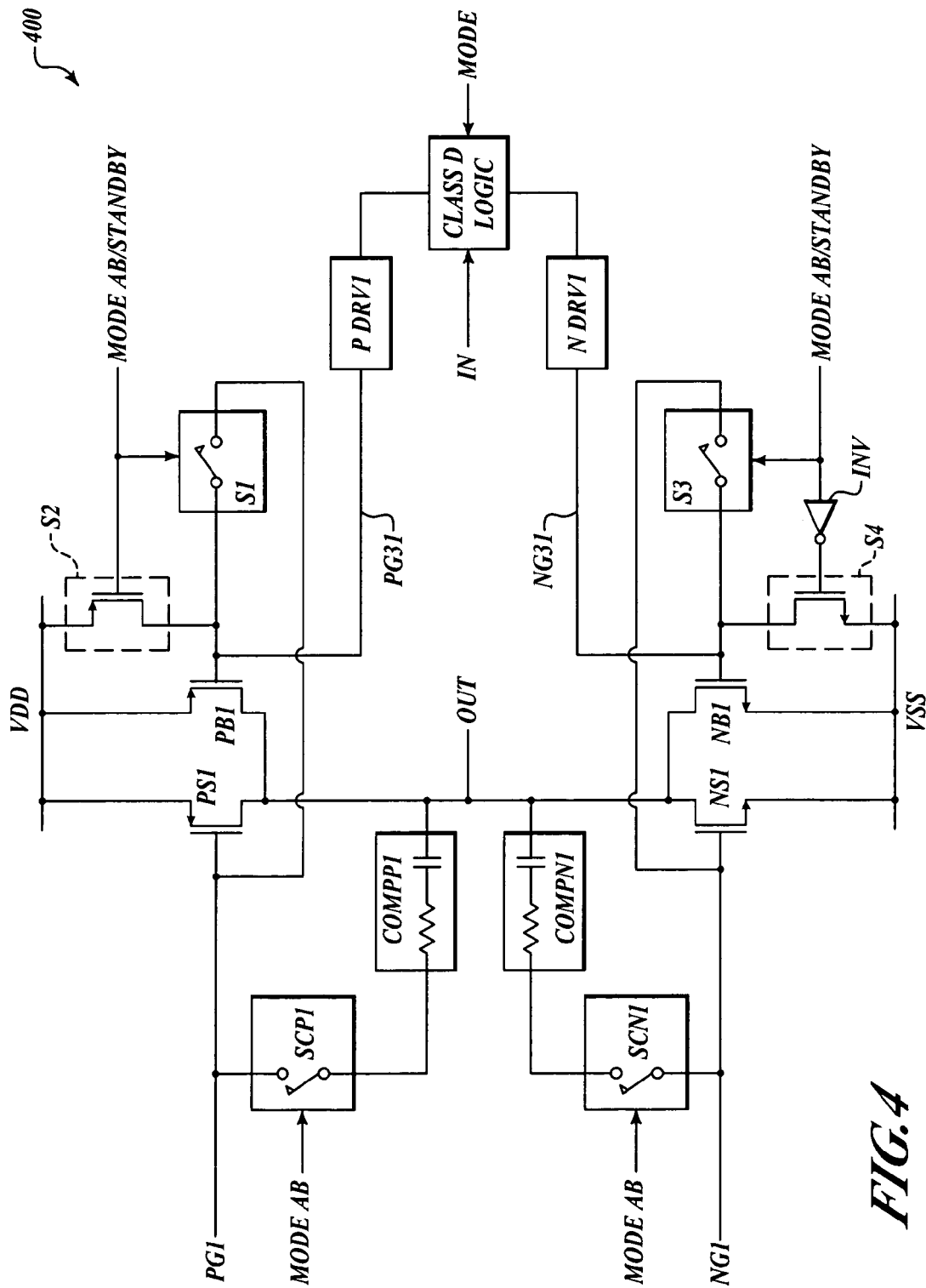
FIG. 4 is a schematic diagram of an example power stage circuit for the example class AB amplifier of FIG. 3.

As illustrated in FIG. 2, CLASS AB AMP1 and CLASS D MOD have a common power stage circuit (POWER STAGE 1). Similarly, CLASS AB AMP2 and CLASS D MOD share another common power stage circuit (POWER STAGE 2). An example shared power stage circuit is illustrated in FIG. 4, which will be discussed later. However, other circuit arrangements can be employed to provide similar functionality and are considered within the scope of the present disclosure.

Figure 3:
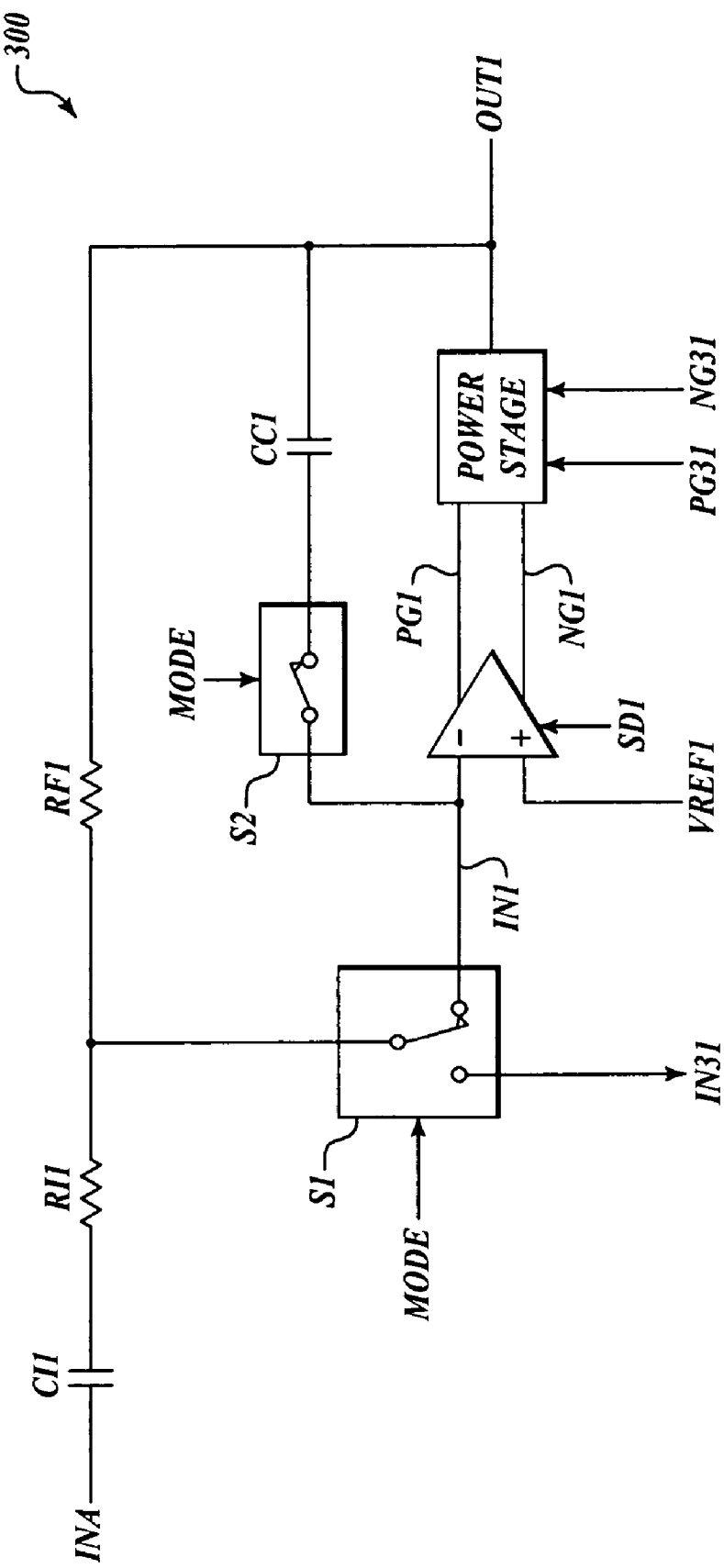
FIG. 3 is a schematic diagram of an example class AB driver circuit arranged for operation in a class AB-D amplifier system.

FIG. 3 is a schematic diagram of an example class AB driver circuit (300) that is arranged for operation in a class AB-D amplifier system. Class AB driver circuit 300 includes two capacitor circuits (CI1, CC1), two resistor circuits (RI1, RF1), a differential amplifier circuit, two switching circuits (S1, S2), and a power stage circuit (POWER STAGE 1). In one example system implementation, Class AB driver circuit 300 may be used in place of switching circuit SW1, CLASS AB DRV1 and POWER STAGE 1 of FIG. 2. However, other circuit arrangements where circuit functions are combined or separated are also contemplated within the spirit of the present disclosure.

Capacitor circuit CI1 is arranged to provide AC coupling of signal INA to one side of resistor circuit RI1. Resistor RF1 is arranged to couple the other side of resistor circuit RI1 to an output of POWER STAGE 1, which corresponds to signal OUT1. Switching circuit S1 is arranged to selectively couple the signal from a common node between resistor circuits RI1 and RF1 to an inverting input (IN1) of the differential amplifier circuit in response to a mode control signal (e.g., MODE). Alternatively, the common node is coupled to a class D modulator (e.g., see FIG. 2) as signal IN31. Another switching circuit (not shown) can be used to couple the inverting input terminal to the non-inverting terminal, or some other defined potential for when the class AB operation is disabled. The differential amplifier circuit includes a non-inverting input that is coupled to reference signal VREF1, an inverting input that is coupled to signal IN1, an enable/disable input that is coupled to signal SD1, a first output that corresponds to signal PG1, and a second output that corresponds to signal NG1. POWER STAGE 1 is arranged to provide output signal OUT1 in response to inputs PG1, NG1 from the differential amplifier circuit, and inputs PG31, NG31 from a class D modulator circuit (e.g., see FIG. 2). Switching circuit S2 is arranged so selectively couple capacitor CC1 from the output of POWER STAGE 1 to the inverting input of the differential amplifier circuit for improved stability performance when operated in class AB mode.

FIG. 4 is a schematic diagram of an example power stage circuit (400) for the example class AB driver of FIG. 3. Power stage circuit 400 includes six switching circuits (S1-S4, SCP1, SCN1), four driver transistors (PS1, PB1, NS1, NB1), two compensation circuits (COMPP1, COMPN1), and an inverter circuit (INV). The schematic also illustrates a class D modulator that includes a p-type driver circuit (P-DRV1), and an n-type driver circuit (N-NDR1), and a class D Logic circuit.

Transistor PS1 includes a source terminal that is coupled to a first power terminal (VDD), a gate terminal that is coupled to signal PG1, and a drain terminal that is coupled to an output (OUT). Transistor PB1 includes a source terminal that is coupled to a first power terminal (VDD), a gate terminal that is coupled to signal PG31, and a drain terminal that is coupled to OUT. Transistor NS1 includes a source terminal that is coupled to a second power terminal (VSS), a gate terminal that is coupled to signal NG1, and a drain terminal that is coupled to OUT. Transistor NB1 includes a source terminal that is coupled to a second power terminal (VSS), a gate terminal that is coupled to signal NG31, and a drain terminal that is coupled to OUT.

Switching circuit S1 is arranged to selectively couple the gate of transistor PB1 to the gate of transistor PS1 when class D mode is enabled, and isolate the gates when class AB mode is enabled. Switching circuit S2 is illustrated as a p-type transistor that is arranged to disable transistor PB1 when class AB mode is enabled, and enables transistor PB1 when class D mode is activated (e.g., class AB mode is inactive). Switching circuit S3 is arranged to selectively couple the gate of transistor NB1 to the gate of transistor NS1 when class D mode is enabled, and isolate the gates when class AB mode is enabled. Switching circuit S4 is illustrated as a n-type transistor that is arranged to disable transistor NB1 when class AB mode is enabled, and enables transistor PB1 when class D mode is activated (e.g., class AB mode is inactive) via inverter circuit INV.

Switching circuits SCP1 and SCN1 are optional switching circuits that provide stability enhancement for operation in class AB mode. When class AB mode is active, switching circuit SCP1 couples compensation circuit COMPP1 between OUT and PG1, while switching circuit SCN1 couples compensation circuit COMPN1 between OUT and NG1. During class D mode, the compensation circuits are not needed such compensation will slow down the rising and falling edges of the output signal, and are thus disabled. The compensation circuits are illustrated as a capacitor that is series coupled to a resistor (e.g., for optimally placing a dominant pole/zero in the overall transfer function for the power stage circuit). However, any other appropriate compensation circuit can be employed as is understood in consideration of the present disclosure.

The class D logic receives control signals for mode selection between class AB and class D operation (e.g., MODE), as well as a set of input signals (IN) such as IN31 and IN32 from FIG. 2. When class D mode is in operation, the class D logic is configured to provide signals effective to operate the drive circuits P-DRV1 and N-DRV1. P-DRV1 is arranged to drive the gate of transistor PB1, while N-DRV1 is arranged to drive the gate of transistor NB1. Transistor PB1 and NB1 are operating during the class D operating mode such that increased output current can be provided to OUT. As such, the effective size of transistors PB1 and NB1 is significantly larger than transistors PS1 and NS1 (e.g., 10×, 100×, etc.). Transistors PS1 and NS1 can also be drive by signals PG31 and NG31 via switching circuits S1 and S3. Switching circuits S1 and S3 can be eliminated when transistors PB1 and NB1 are sized to provide sufficient current without transistors PS1 and NS1.

Figure 5:
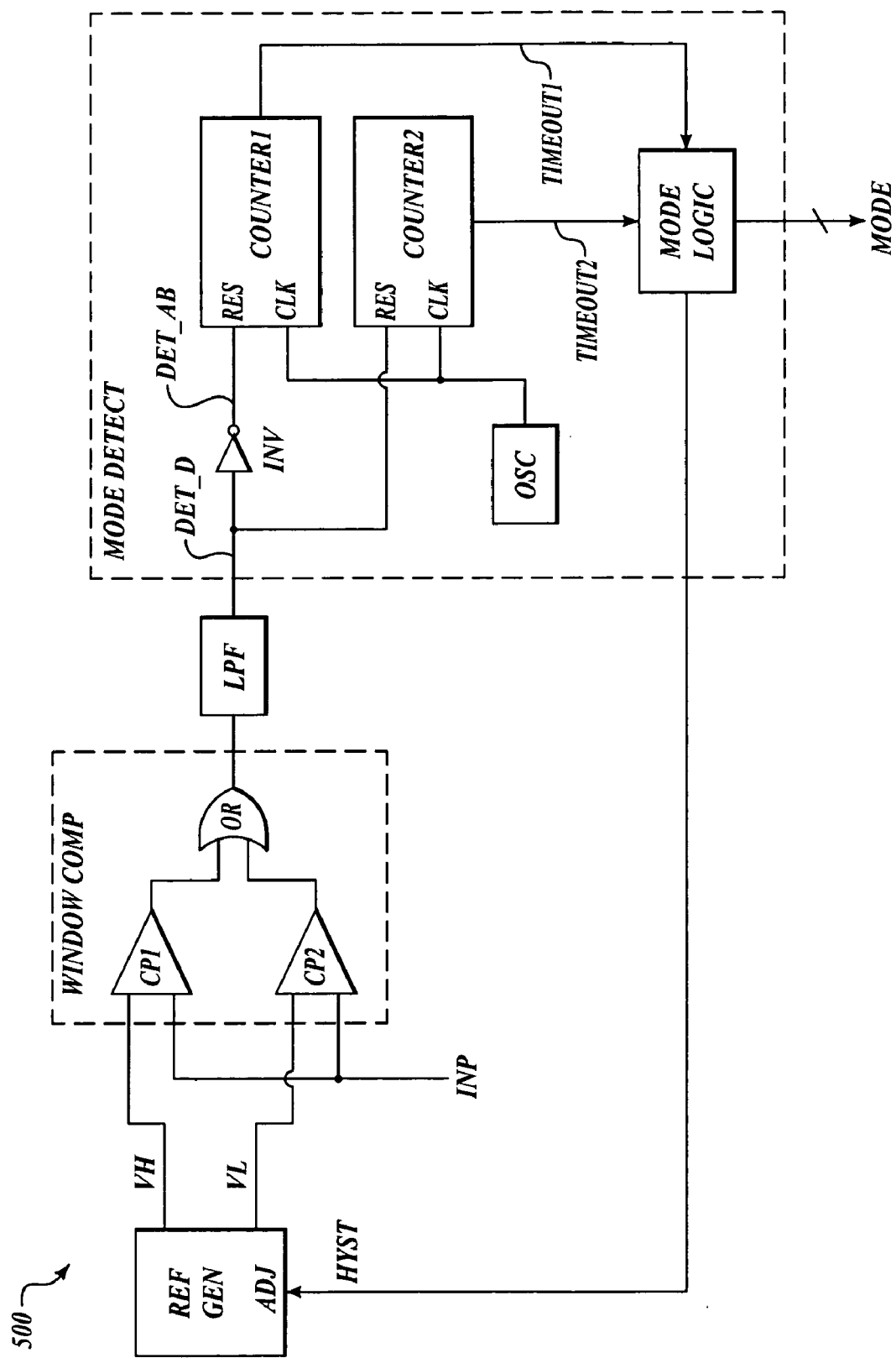
FIG. 5 is a schematic diagram for a mode control circuit for an example class AB-D amplifier.

FIG. 5 is a schematic diagram for a mode control circuit (500) for an example class AB-D amplifier system. Mode control circuit 500 includes a reference generator circuit (REF GEN), a window comparator circuit (WINDOW COMP), a low pass filter circuit (LPF), and a mode detection circuit (MODE DETECT). WINDOW COMP includes two comparators CP1, CP2, and an or-logic circuit (OR). MODE DETECT includes an oscillator circuit (OSC), an inverter-logic circuit (INV), two counters (COUNTER 1, COUNTER 2), and a mode logic circuit (MODE LOGIC).

REF GEN is arranged to provide reference signals VH and VL, which can be adjusted in response to a control signal (e.g., HYST). WINDOW COMP is arranged to compare an input signal (INP) to the reference signals (VH, VL) and provide an output signal whenever INP either exceeds VH or drops below VL. LPF receives the output of WINDOW COMP and provides a filtered (or averaged) signal to MODE DETECT as signal DET_D. When signal DET_D corresponds to logic "0", the signal levels are sufficiently low to indicate class AB operation may be appropriate. When signal DET_D corresponds to logic "1", the signal levels are sufficiently high to indicate class D operation may be appropriate. COUNTER 1 is arranged to reset its count whenever class AB operation seems appropriate, while COUNTER 2 is arranged to reset its count whenever class D operation seems appropriate. MODE LOGIC is arranged to receive timeout signals (TIMEOUT1, TIMEOUT2) from the counters and provide one or more mode selection signals (MODE), as well as an optional adjustment control adjustment to the reference levels (HYST).

The oscillator is arranged to provide a clocking signal to the counter circuits such that they count (either up or down) to reach a predetermined count level unless interrupted by their respective reset signals. COUNTER 1 and COUNTER 2 each have a count level (MAX1 for COUNTER1 and MAX2 for COUNTER 2) that when exceeded (either by counting up or down) indicates a timeout condition has been reached. For example, when class D operation is detected for a counter interval corresponding to MAX1, signal TIMEOUT1 is asserted. Similarly, when class AB operation is detected for a counter interval corresponding to MAX2, signal TIMEOUT2 is asserted.

In one example, MODE LOGIC is arranged to select a class AB operating mode when signal DET_D remains logic "0" sufficiently long enough for signal TIMEOUT2 to trip. In another example, MODE LOGIC is arranged to select a class D operating mode when signal DET_D remains logic "1" sufficiently long enough for signal TIMOUT1 to trip.

Although COUNTER1 and COUNTER2 have been described as being reset when signal DET_D changes states, such counters can also be arranged such that: their counts continue in an opposite direction when signal DET_D changes state, their counts are suspended when signal DET_D changes state, or some other condition that provides some delay/noise-immunity between changing operating modes. In one example, signal VH is decreased once the class D operating mode is detected such that the input signal(s) must decrease below a different level (providing Hysterisis). In another similar example, signal VL is increased once the class D operating mode is detected. After a transition from class D to class AB mode, the signal levels for reference signals VH and VL can be increased again such that noise immunity around the trip point for WINDOW COMP is achieved. In another example, the functions of COUNTER1 and COUNTER2 can be combined into a single circuit.

Figure 6:
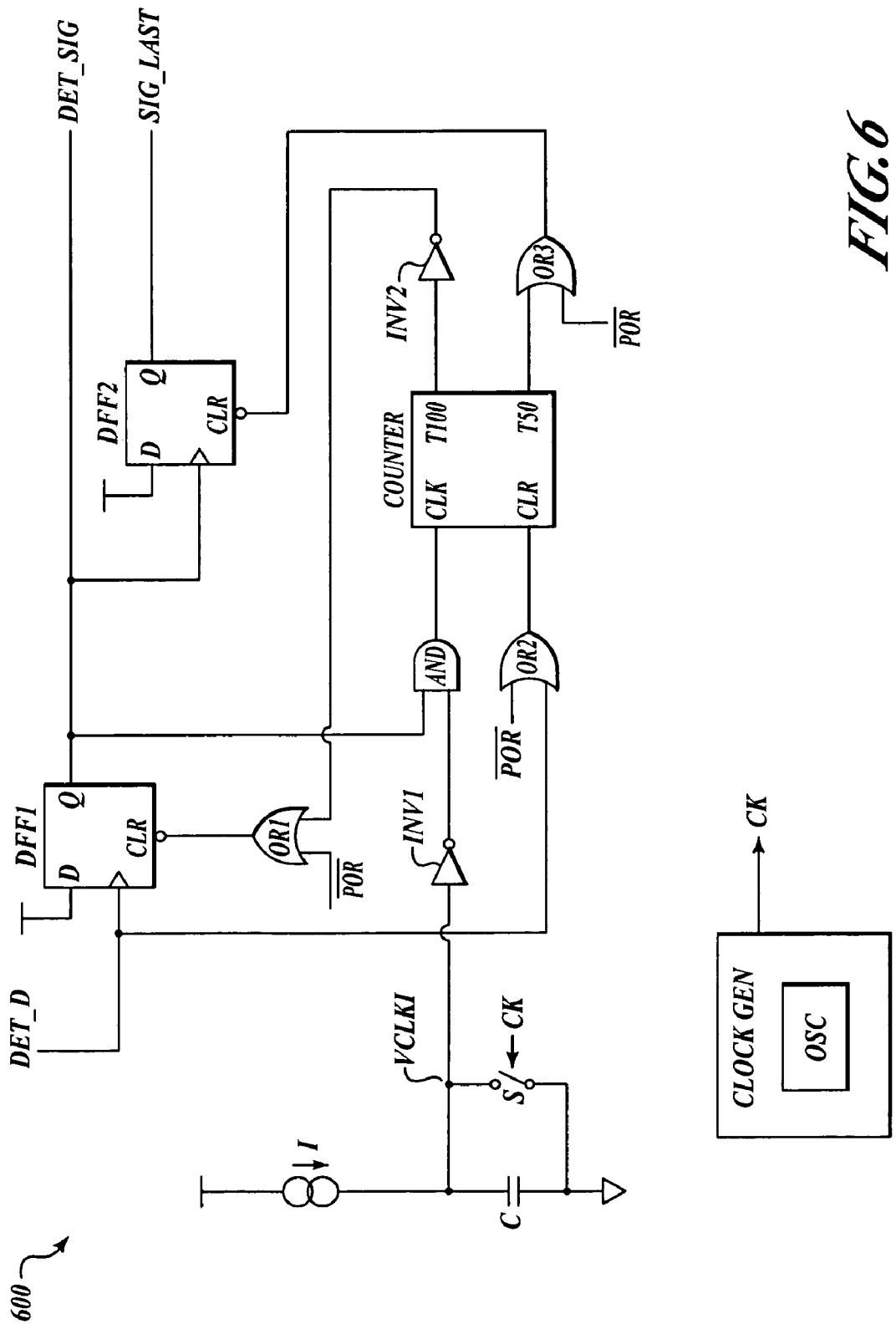
FIG. 6 is a schematic diagram for a mode detection circuit for the mode control circuit of FIG. 5.

FIG. 6 is a schematic diagrams for a mode detect circuit (600) that can be used in place of MODE DETECT from FIG. 5. Mode detect circuit 600 includes a ramp generator circuit, two memory circuits (DFF1, DFF2), a counter circuit (COUNTER), a clock generator circuit (CLOCK GEN) and some miscellaneous logic circuits (OR1, OR2, OR3, INV1, INV2, AND).

The ramp generator is illustrates as a current source (I) that charges a capacitor (C) when switch S is in an open condition. Capacitor C is discharged whenever the clock signal (CK) is in a logic "1" state. CLOCK GEN, which may include an oscillator, can be used to periodically reset the capacitor by asserting signal CK. The voltage on capacitor C corresponds to an input clock voltage (VCLKI) that is used by COUNTER via logic circuits INV1 and AND. The ramp generator assists in reducing noise problems related to signal CK, which may be generated a large distance from the mode detect circuit. However, in other implementations, signal VCLKI may simply be an input to the mode detect circuit without the need for the ramp generator.

DFF1 is arranged to assert its Q output whenever signal DET_D transitions to a high logic level. The Q output of DFF1 is reset to a non-asserted (e.g., logic "0") condition by either a POR condition or when COUNTER reaches count T100. The Q output of DFF1 indicates that a signal is detected (signal DET_SIG) whenever DET_D is asserted.

DFF2 is arranged to assert its Q output whenever a high transition occurs in the Q output of DFF1. The Q output of DFF2 is reset to a non-asserted condition (e.g., logic "0") by either a POR condition or when COUNTER has a count that is below count T50. The Q output of DFF2 indicates that a class D input signal has lasted (e.g., signal SIG_LAST) by at least count T50 (e.g., a 50 ms count). After the T50 count has been reached the CLR signal on DFF2 is released.

COUNTER is cleared by signal CLR by either a POR condition or when signal DET_D transitions to a low logic level. A clock signal is provided to the CLK input of COUNTER when DET_SIG is asserted, such that the counter(s) within the block are free to change their internal counter values (assuming no POR condition). In one example count T50 is arranged to change states after 50 ms of time relative to CK while count T100 is arranged to change states after 100 ms. After the 100 ms time interval has been reached in COUNTER, DFF1 is again reset.

Figure 7:
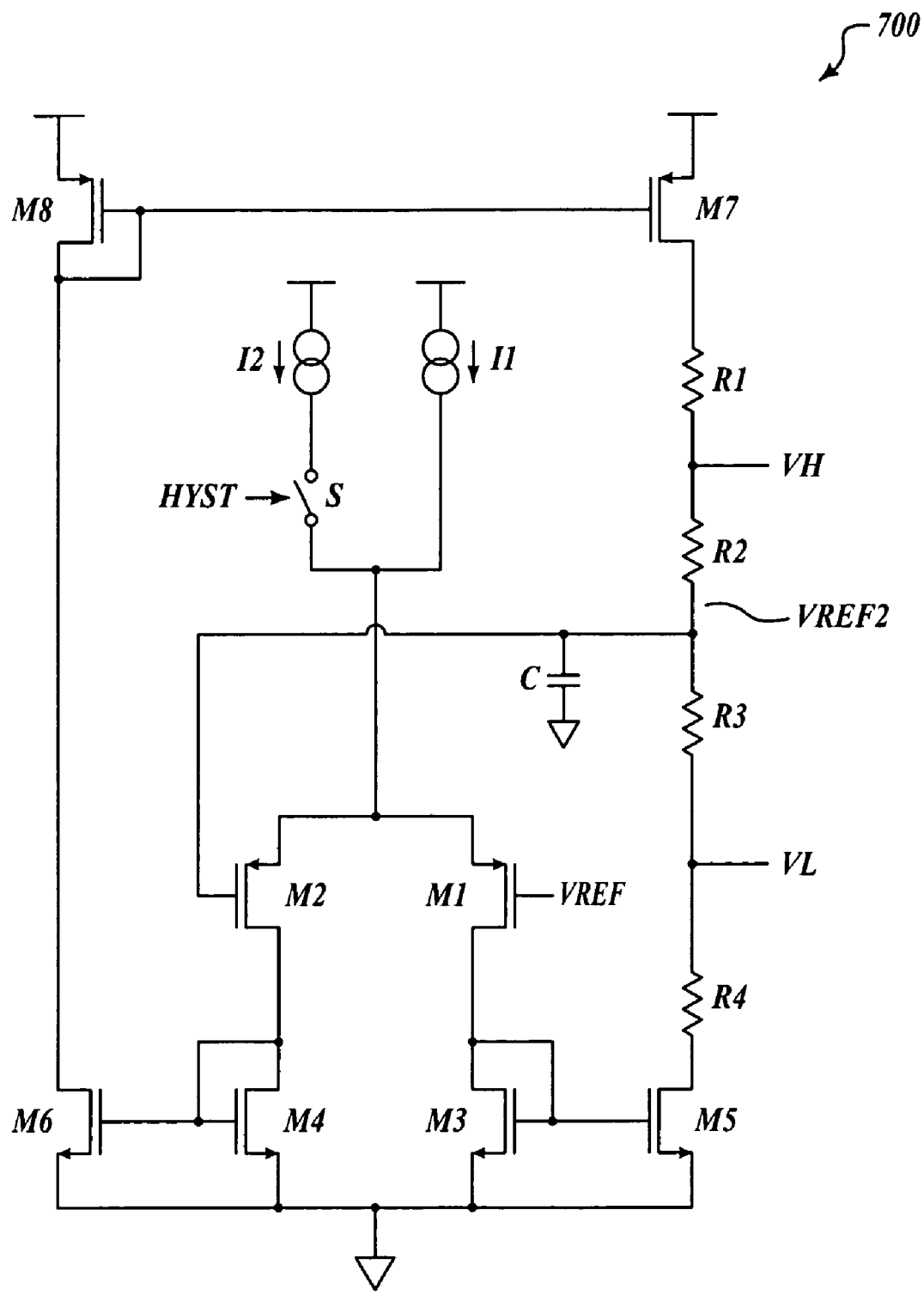
FIG. 7 is a schematic diagram for an example reference generator circuit for the mode control circuit of FIG. 5.

FIG. 7 is a schematic diagram for an example reference generator circuit (700) for the mode control circuit of FIG. 5. Reference generator circuit 700 includes two current sources (I1, I2), a switch circuit (S), a capacitor circuit (C), four resistor circuits (R1-R4), and eight transistors (M1-M8).

Transistor M1 and M2 are arranged in a differential pair configuration, with common sources coupled to current source I1. Current source I2 is selectively coupled in parallel with current source I1 in response to signal HYST via switch circuit S. The gate of transistor M1 is arranged to receive a reference voltage (VREF), such as from a bandgap reference circuit or from some other externally controlled voltage. The gate o transistor M2 is coupled to an output node as designated by VREF2. Capacitor C is coupled to the gate of transistor M2.

The gate/drain of transistor M4 is coupled to the drain of transistor M2, while the gate/drain of transistor M3 is coupled to the drain of transistor M1. Transistors M3 and M4 are diode-coupled devices that are each arranged as half of a current mirror circuit formed by transistor pairs M4/M6 and M3/M5, respectively. The drain of transistor M6 is coupled to the gate/drain of transistor M8. Transistors M7 and M8 are arranged in a current mirror configuration. The drain of transistor M7 is coupled to the drain of transistor M5 via series coupled resistor circuits R1-R4.

The node between resistors circuits R1 and R2 is designated as the high reference voltage (VH), while the node between resistor circuits R3 and R4 is designated as the low reference voltage (VL). Voltages VH and VL are equidistant about voltage VREF2 when resistor circuits R2 and R3 have equal resistance values. The amplifier operation of the differential pair is arranged such that additional current is coupled through resistor circuits R1-R4 when switch S is operated in a closed position. Although VREF2 is substantially held at a constant voltage substantially equal to VREF, the value associated with voltages VH and VL will be changed by closing and opening switching circuit S. For equal value resistances, VH and VL will be increased/decreased by equal amounts away from VREF by such switch operation.

Figure 8:
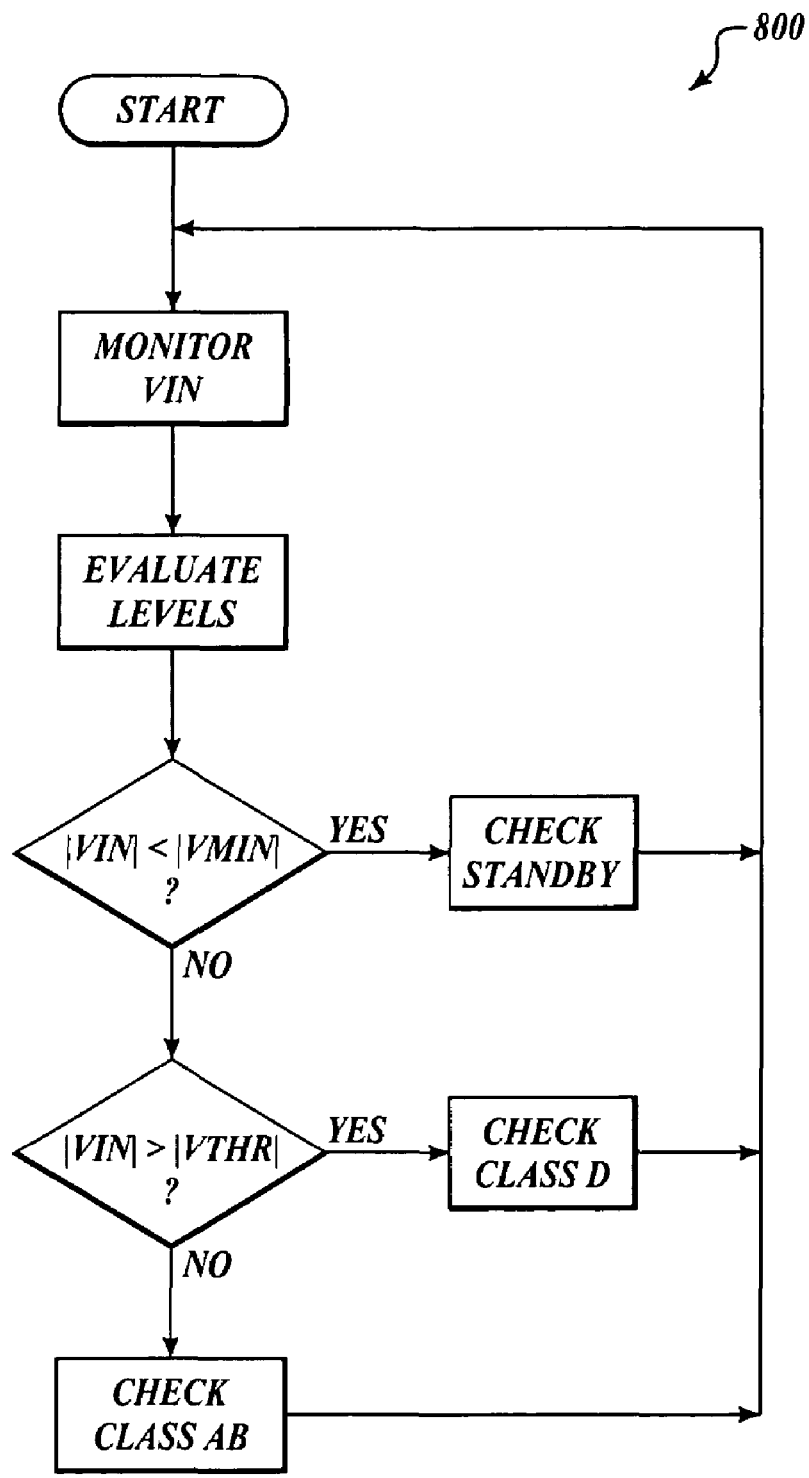
FIG. 8 is a procedural flow diagram for a class AB-D mode selector.

FIG. 8 is a procedural flow diagram (800) for a class AB-D mode selector. The input voltage(s) of the audio signal is monitored (MONITOR VIN). The input levels are then evaluated (EVALUATE LEVELS). When the magnitude of the input signal level (VIN) is below a minimum signal level (e.g., VMIN) the mode selector determines if STAND BY operating mode should be activated (CHECK STAND BY). When the magnitude of the input signal level (VIN) exceeds a maximum signal level (e.g., VTHR) the mode selector determines if CLASS D operating mode should be activated (CHECK STAND BY). When the magnitude of the input signal level (VIN) is between the minimum and maximum signal levels (e.g., inside the window), the mode selector determines if CLASS AB operating mode should be activated (CHECK CLASS AB).

Figure 9:
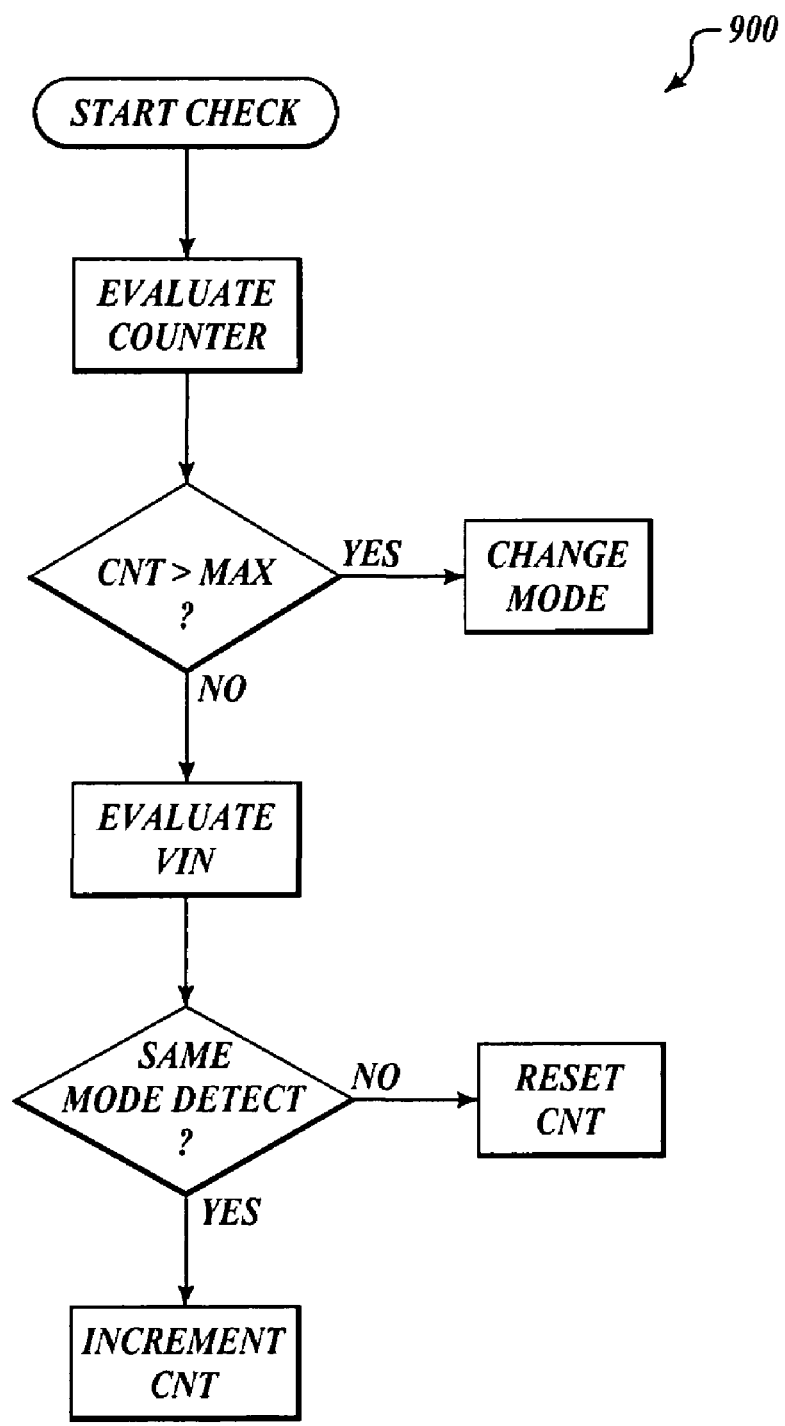
FIG. 9 is a procedural flow diagram for the check class AB procedure of FIG. 8, arranged in accordance with at least one feature of the present disclosure.

FIG. 9 is a procedural flow diagram (900) for a check operating class procedure (e.g., CHECK CLASS AB, CHECK CLASS D) of FIG. 8. At the start of the check procedure a counter is evaluated (EVALUATE COUNTER). When the counter exceeds a maximum count (MAX) the mode is changed (CHANGE MODE). When the counter is below the maximum count (CNT<MAX) the procedure evaluates the input signal levels (EVALUATE VIN). When the counter is below MAX and the same mode is detected the counter is incremented (INCR CNT). When the counter is below MAX and a different mode is detected, the counter is reset (RESET CNT). Alternatively, the counter can be decremented when the counter is below MAX and a different mode is detected.

In one example, the operating mode is currently class AB and the signal levels are detected as exceeding the levels for class AB operation. In this example, the operating mode will not change to class D unless the signal levels persist long enough for the counter to reach MAX. In another example, the operating mode is currently class AB operation, and the signal levels have dropped below the levels for class AB operation. In this example, the operating mode will not go into STAND BY unless the low signal level persists for a long enough time to indicate no audio signal. In still another example, the operating mode is currently class D operation and the signal levels have dropped below the levels for class D operation. In this example, the operating mode will not change to class AB or standby unless the reduced signal levels persist long enough to indicate that the audio signal is either no longer present or dramatically decreased in amplitude.

The above-described circuit topologies allow operation of the audio power amplifier in either class AB and class D operating modes. During the class AB operating mode, excellent linear amplification is achieved with low noise and low THD. When the system detects a significant increase in the demand for output power, the circuits switch over into a class D operating mode. Detector circuits identify when the output power level demand decreases such that the amplifier can switch back to either class AB operation or into a standby mode depending on the signal levels. Employing the described features, no filter is required at the load even in class D operation.

Although the invention has been described herein by way of exemplary embodiments, variations in the structures and methods described herein may be made without departing from the spirit and scope of the present disclosure. For example, the positioning of the various components may be varied. Individual components and arrangements of components may be substituted as known to the art. Circuit functions can be combined and/or separated into additional parts as may be desired for certain implementations. Since many embodiments of the invention can be made without departing from the spirit and scope of the invention, the invention is not limited except as by the appended claims.

What is claimed is:

1. An apparatus for providing an output signal across a load, wherein the output signal corresponds to an amplified version of an input signal, the apparatus comprising:
   a mode control circuit that is arranged to select an operating mode associated with the apparatus, wherein the operating mode corresponds to either a class AB operating mode, or a class D operating mode;
   a class D driver circuit that is arranged to provide a first drive signal in response to the input signal;
   a class AB driver circuit that is arranged to provide a second drive signal in response to the input signal, the class AB driver circuit further comprising a first class AB driver circuit and a second class AB driver circuit, wherein the input signal comprises a differential signal that includes a first input signal and a second input signal, wherein the first class AB driver circuit is responsive to the first input signal, and wherein the second class AB driver circuit is responsive to the second input signal; and
   a power stage circuit that is arranged to provide the output signal across the load in response to one of the first drive signal and the second drive signal, wherein the power stage circuit is configured to respond to the first drive signal when the operating mode corresponds to the class D operating mode, and wherein the power stage circuit is configured to respond to the second drive signal when the operating mode corresponds to the class AB operating mode.

2. The apparatus of claim 1, further comprising a zero sense circuit that is arranged to monitor the output signal, wherein the zero sense circuit is arranged in cooperation with the mode control circuit to hold-off changing between the class D operating mode and the class AB operating mode until the zero sense circuit indicates that a current to the load is substantially zero.

3. The apparatus of claim 1, the power stage circuit comprising: a first transistor circuit that is arranged to provide a source current to the load when active, and a second transistor circuit that is arranged to provide a sink current from the load when active.

4. The apparatus of claim 1, wherein the power stage circuit comprises a first transistor and a second transistor, wherein: the first transistor and the second transistor both include drains that are coupled to the load, the first transistor is arranged to respond to the first drive signal when the operating mode corresponds to the class D operating mode, and the second transistor is arranged to respond to the second drive signal when the operating mode corresponds to the class AB operating mode.

5. The apparatus of claim 4, wherein the power stage circuit is further arranged such that the second transistor responds to the first drive signal when the operating mode corresponds to the class D operating mode.

6. An apparatus for providing an output signal across a load, wherein the output signal corresponds to an amplified version of an input signal, the apparatus comprising:
   a mode control circuit that is arranged to select an operating mode associated with the apparatus, wherein the operating mode corresponds to either a class AB operating mode or a class D operating mode;
   a class D driver circuit that is arranged to provide a first drive signal in response to the input signal;
   a class AB driver circuit that is arranged to provide a second drive signal in response to the input signal;
   a power stage circuit that is arranged to provide the output signal across the load in response to one of the first drive signal and the second drive signal, wherein the power stage circuit is configured to respond to the first drive signal when the operating mode corresponds to the class D operating mode, and wherein the power stage circuit is configured to respond to the second drive signal when the operating mode corresponds to the class AB operating mode; and
   an input level detection circuit that is arranged to monitor the input signal, wherein the input level detection circuit is arranged in communication with the mode control circuit such that the mode control circuit determines the operating mode based upon a detected input signal level.

7. The apparatus of claim 6, further comprising a switching circuit that is arranged to receive the input signal, wherein the switching circuit is arranged in cooperation with the mode control circuit to: couple a first input signal to the class AB driver circuit when the operating mode corresponds to the class AB operating mode, and couple a second input signal to the class D modulator circuit when the operating mode corresponds to the class D operating mode.

8. The apparatus of claim 6, wherein the class AB driver circuit comprises: a first gain selection component that is coupled between the input signal and an intermediate node, a second gain selection component that is coupled between the intermediate node and the load, a differential amplifier that includes: a first input terminal, second input terminal, and an output terminal, wherein the first input terminal is selectively coupled to the intermediate node, the second input terminal is coupled to a reference voltage, and the output terminal is coupled to the power stage circuit as the second drive signal.

9. The apparatus of claim 8, wherein the class AB driver circuit further comprises: a first switching circuit, a second switching circuit, and a capacitor circuit, wherein: the first switching circuit is arranged to selectively couple the intermediate node to the first input terminal when the class AB operating mode is active, the first switching circuit is arranged to decouple the first input terminal from the intermediate node when the class D operating mode is active, the second switching circuit is arranged to couple the capacitor circuit between the load and the intermediate terminal when the class AB operating mode is active, and wherein the second switching circuit is arranged to decouple the capacitor circuit from the intermediate node when the class D operating mod is active.

10. The apparatus of claim 6, wherein the class AB driver circuit is arranged such that the second drive signal corresponds to at least one member from the group comprising: a single ended signal, a differential signal, an n-type drive signal, and a p-type drive signal.

11. The apparatus of claim 6, wherein the class D modulator circuit is arranged such that the first drive signal corresponds to at least one member from the group comprising: a single ended signal, a differential signal, an n-type drive signal, and a p-type drive signal.

12. An apparatus for providing an output signal across a load, wherein the output signal corresponds to an amplified version of an input signal, the apparatus comprising:
   a mode control circuit that is arranged to select an operating mode associated with the apparatus, wherein the operating mode corresponds to either a class AB operating mode or a class D operating mode, wherein the mode control circuit further comprises a mode detection circuit and a comparator circuit, wherein the comparator circuit is arranged to evaluate a signal magnitude associated with the input signal, and wherein the mode detection circuit is arranged to select: the class AB operating mode when the signal magnitude is below a first signal threshold level, and the class D operating mode when the signal magnitude is above a second signal threshold level;

a class D driver circuit that is arranged to provide a first drive signal in response to the input signal;

a class AB driver circuit that is arranged to provide a second drive signal in response to the input signal; and a power stage circuit that is arranged to provide the output signal across the load in response to one of the first drive signal and the second drive signal, wherein the power stage circuit is configured to respond to the first drive signal when the operating mode corresponds to the class D operating mode, and wherein the power stage circuit is configured to respond to the second drive signal when the operating mode corresponds to the class AB operating mode.

13. The apparatus of claim 12, wherein the first signal threshold level and the second signal threshold level are substantially the same.

14. The apparatus of claim 12, the mode control circuit further comprising a reference generator circuit that is arranged to adjust either the first signal threshold level or the second signal threshold level when the operating mode changes between the class AB operating mode and the class D operating mode.

15. The apparatus of claim 12, the mode control circuit further comprising: at least one timer circuit is arranged to provide a timeout indication when the signal magnitude exceeds at least one of the first and second signal threshold levels for a predetermined time period.

16. A method for selecting an operating mode in an audio amplifier circuit, wherein the audio amplifier circuit is arranged to provide an output signal across a load in response to an input signal, the method comprising:

monitoring a signal magnitude associated with the input signal;

evaluating the signal magnitude;

selecting a class AB operating mode for the audio amplifier circuit when the signal magnitude is below a first maximum signal threshold level; and selecting a class D operating mode for the audio amplifier circuit when the signal magnitude exceeds a second maximum signal threshold.

17. The method of claim 16, wherein the first maximum signal threshold level is substantially the same as the second maximum signal threshold level.

18. The method of claim 16, further comprising: adjusting at least one of the first maximum signal threshold level and the second maximum signal threshold level when the operating mode changes between class AB operating mode and class D operating mode.

19. The method of claim 16, further comprising: delaying the selection between the class AB operating mode and the class D operating mode until the detected operating mode change has persisted for at least one predetermined time interval.

20. The method of claim 16, further comprising: delaying the transition between the class D operating mode and the class AB operating mode until a detected load current level is substantially zero.

21. An apparatus for selecting an operating mode in an audio amplifier circuit, wherein the audio amplifier circuit is arranged to provide an output signal across a load in response to an input signal, the apparatus comprising:

a means for monitoring a signal magnitude associated with the input signal;

a means for evaluating the signal magnitude;

a means for selecting a class AB operating mode for the audio amplifier circuit when the signal magnitude is below a first maximum signal threshold level for at least a first time interval; and a means for selecting a class D operating mode for the audio amplifier circuit when the signal magnitude exceeds a second maximum signal threshold for at least a second time interval.

* * * * *